United States Patent [19]
Beckenbaugh et al.

[11] Patent Number: 5,593,903
[45] Date of Patent: Jan. 14, 1997

[54] METHOD OF FORMING CONTACT PADS FOR WAFER LEVEL TESTING AND BURN-IN OF SEMICONDUCTOR DICE

[75] Inventors: William M. Beckenbaugh, Scottsdale; William H. Lytle, Chandler; Bernard Berman, Phoenix, all of Ariz.

[73] Assignee: Motorola, Inc., Schaumburg, Ill.

[21] Appl. No.: 606,472

[22] Filed: Mar. 4, 1996

[51] Int. Cl.⁶ .................................................. H01L 21/66
[52] U.S. Cl. .................. 437/8; 437/190; 437/226
[58] Field of Search ..................... 437/8, 51, 190, 437/226; 148/DIG. 28, DIG. 162

[56] References Cited

U.S. PATENT DOCUMENTS

| | | | |
|---|---|---|---|
| 5,237,269 | 8/1993 | Aimi et al. | 437/8 |
| 5,289,631 | 3/1994 | Koopman et al. | 437/8 |
| 5,487,999 | 1/1996 | Farnworth | 437/8 |
| 5,495,667 | 3/1996 | Farnworth et al. | 437/8 |

*Primary Examiner*—Chandra Chaudhari
*Attorney, Agent, or Firm*—Rennie William Dover; Harry A. Wolin

[57] ABSTRACT

A method of forming contact pads (140) that allows for wafer level testing and burn-in of semiconductor die (22). A plurality of semiconductor die (22) are formed upon a semiconductor wafer (20), each semiconductor die (22) having a plurality of bonding pads (78). A contact pad (140) is formed overlying each bonding pad (78) and is electrically coupled to the bonding pad (78) and to wafer test pads (38) through vertical and/or horizontal wafer conductors (42–47 and 52–53 respectively) so that each semiconductor die (22) is uniquely identified. Contact pads (140) protect underlying bonding pads (78) during the formation and removal of vertical and/or horizontal wafer conductors (42–47 and 52–53 respectively). Thus, wafer level electrical testing and/or burn-in can be performed prior to designating a final packaging method for the semiconductor die (22).

22 Claims, 7 Drawing Sheets

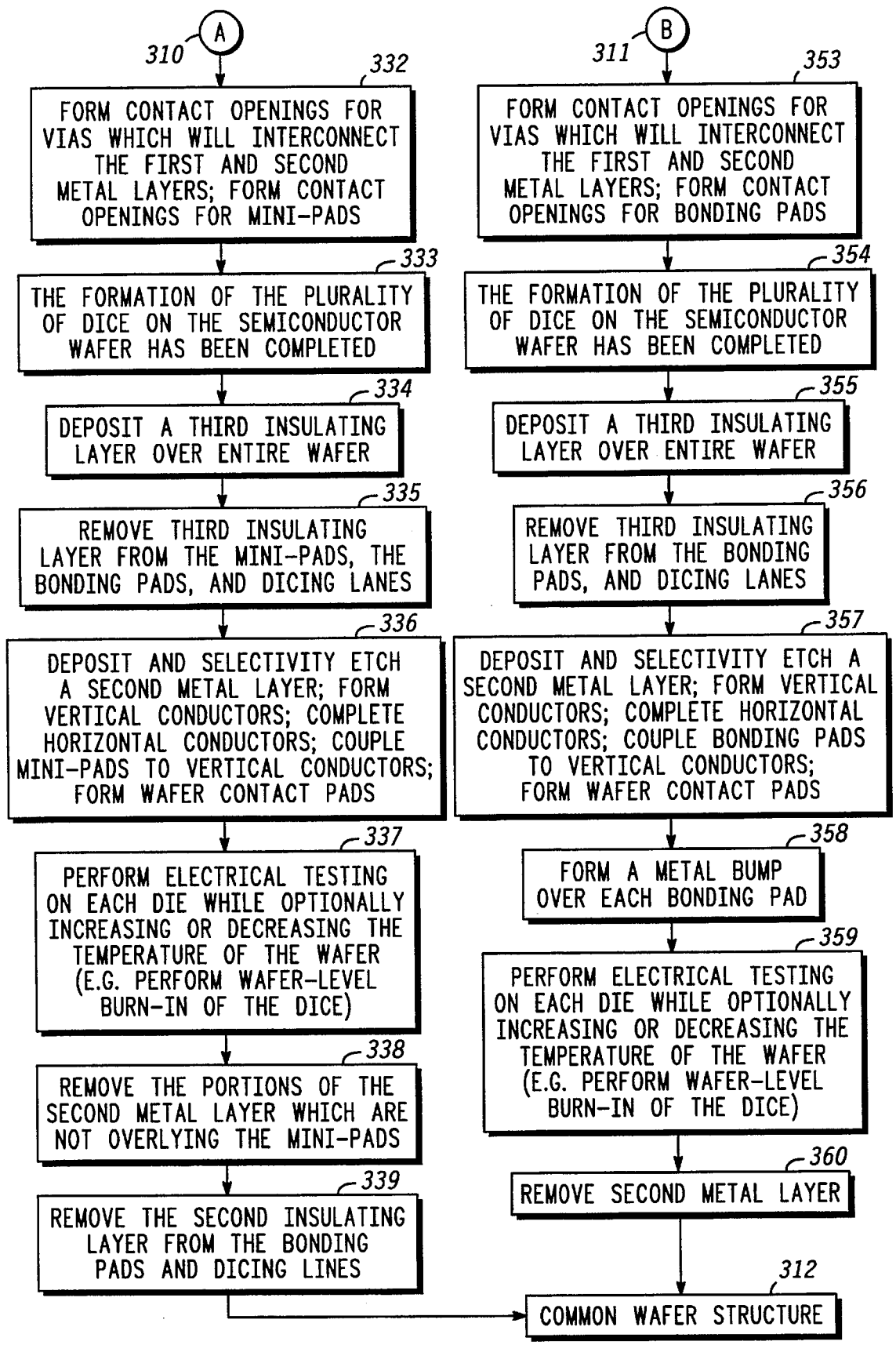
FIG. 8 -PRIOR ART- 5,593,903

METHOD OF FORMING CONTACT PADS FOR WAFER LEVEL TESTING AND BURN-IN OF SEMICONDUCTOR DICE

BACKGROUND OF THE INVENTION

The present invention relates in general to integrated circuit dice and more particularly to a method of metallization for wafer level electrical testing of integrated circuit dice.

One factor that has been identified as critical to the continued success of the semiconductor industry, is the ability to identify a "known good die" (KGD). Typically, a KGD is one which has not only passed some preliminary electrical test, but also one in which there is essentially 100% confidence that it will function when packaged and made part of a customer's application. This must be true whether the die is packaged singly or as part of a multichip module (MCM).

The importance of having a KGD for inclusion in a MCM can be illustrated by comparing the test yield of a MCM assembled with KGD to that of a MCM assembled with dice having individual die yields of 95%. The test yield of a MCM containing ten die is a function of the individual die yield and the assembly yield of the MCM. Thus, where the individual die yields are 95%, the test yield of the MCM is at best the product of the individual die yields or 59.8%. This result is unacceptable. On the other hand, if each of the ten die were a KGD, the individual die yield would be essentially 100%. Thus the MCM yield would only be a function of module assembly operations, and could approach 100%.

One common method of determining KGD, is to first test each die individually, or in small aggregates, using costly wafer probe equipment while the dice are in wafer form. The dice are then singulated, or separated into individual die, and each die is packaged for a reliability testing procedure commonly referred to as burn-in. It has been found that the early failure or "infant mortality" can be predicted to occur within a particular period of time. Therefore burn-in testing involves testing the integrated circuit for that particular period of time, typically at elevated temperatures. The cost of this type of testing is high due to the cost of singulation, packaging and individual die burn-in.

Methods for reducing the cost of testing and burn-in have been under intense investigation. One such method is a subject of U.S. Pat. No. 5,399,505, entitled "METHOD AND APPARATUS FOR PERFORMING WAFER LEVEL TESTING OF INTEGRATED CIRCUIT DICE", issued Mar. 21, 1995 to Edward C. Dasse et al., and assigned to the same assignee, Motorola, Inc. The '505 patent is hereby incorporated by reference. The patent describes, in part, a semiconductor wafer having integrated circuit dice, wafer conductors and wafer test pads formed thereon. More specifically, the patent discloses, among other things, a first method that is suitable for dice that will be wire bonded when packaged, and a second method suitable for dice that will have bumps formed overlying bonding pad areas on each die.

While the methods of U.S. Pat. No. 5,399,505 meet the needs of the industry as described therein, they are somewhat inflexible in that they require that each wafer and the integrated circuit dice thereon be committed to a specific type of assembly process at a step just prior to the formation of a first metal or first conductive layer. This is well before testing and burn-in.

Therefore, it would be advantageous to have a method for wafer level testing that would allow for flexibility in the ultimate packaging of the dice and not require any advance commitment. In addition, it would be advantageous to develop a method that minimizes the number of process steps required, thus making the process more cost effective.

SUMMARY OF THE INVENTION

The present invention includes a method of forming wafer conductors, wafer test pads and contact pads upon a surface of a semiconductor wafer for wafer level testing. The wafer conductors are electrically coupled to bonding pads on each of a plurality of integrated circuit die formed on the semiconductor wafer at a first end and to wafer test pads, formed at the periphery of the semiconductor wafer, at a second end. Thus, the wafer conductors, wafer test pads and contact pads allow each integrated circuit die to be accessed individually for electrical testing. In addition, the wafer conductors, wafer test pads and contact pads can be utilized to allow each of the integrated circuit die to undergo electrical burn-in. When wafer conductors, wafer test pads and contact pads, formed in accordance with an embodiment of the present invention, are removed, the bonding pads of each integrated circuit die are essentially returned to the same condition they had prior to the formation of the wafer conductors, wafer test pads and contact pads. Thus the integrated circuit dice are suitable for a variety of bonding methods such as wire bonding, thermal compression bonding and the like.

BRIEF DESCRIPTION OF THE DRAWINGS

FIGS. 7–8 illustrate, in flow diagram form, the process flow for the prior art embodiments of FIGS. 3–4 respectively.

DETAILED DESCRIPTION OF THE DRAWINGS

Figure 1:
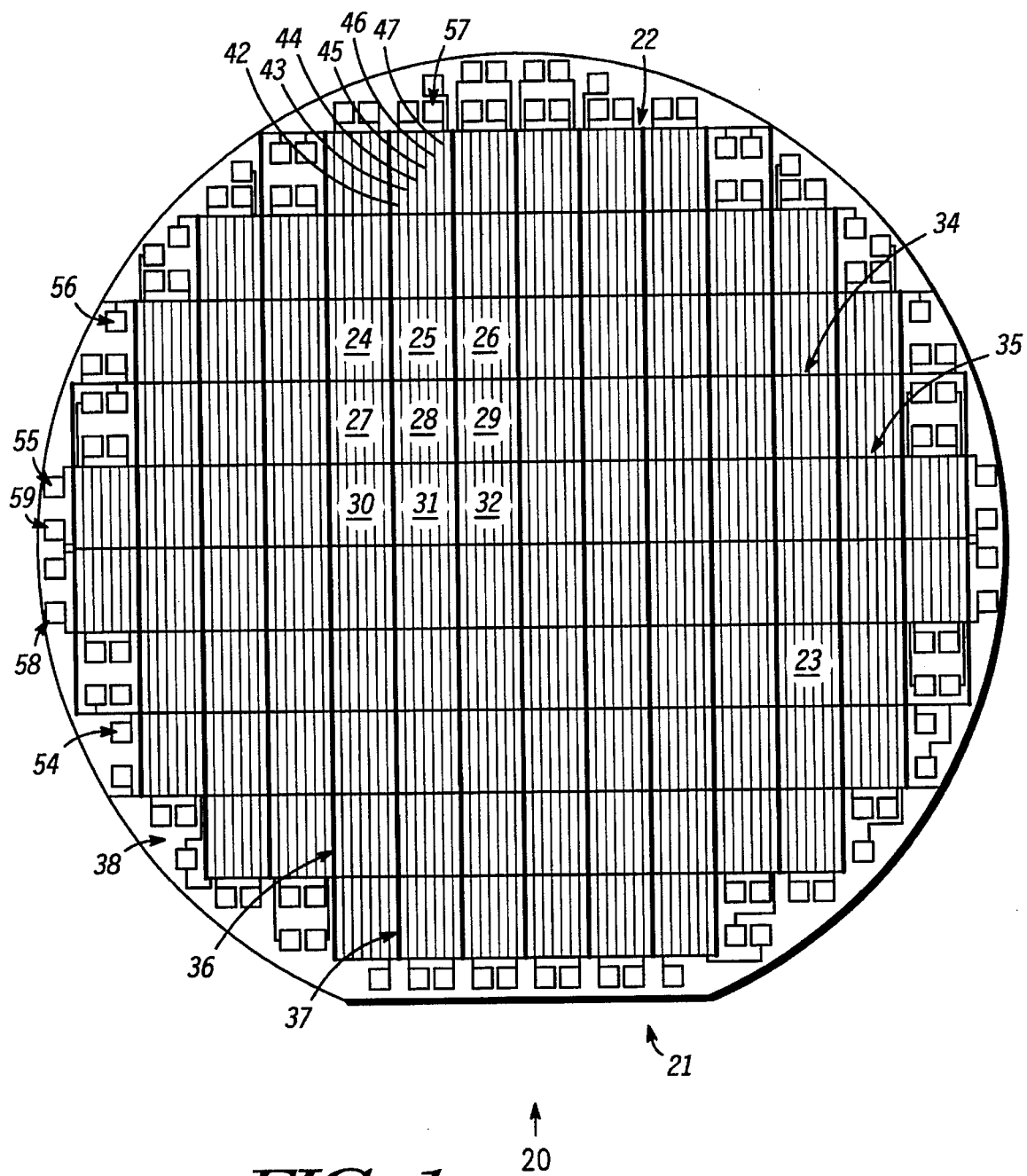
FIG. 1 is an enlarged plan view of a semiconductor wafer fabricated in accordance with an embodiment of the present invention.

FIG. 1 is a plan view of a semiconductor substrate or wafer 20, having wafer flat 21, fabricated in accordance with an embodiment of the present invention. Semiconductor wafer 20 has a plurality of integrated circuit dice or semiconductor dice 22 which are formed thereon. Each die of the plurality of integrated circuit dice 22 have a plurality of bonding pads (not shown) thereon. Integrated circuit die 23, 24, 25, 26, 27, 28, 29, 30, 31 and 32 are each members of plurality of integrated circuit dice 22.

As it is known, plurality of integrated circuit dice 22 are formed so as to be arranged in a plurality of rows and columns separated by a plurality of dicing lanes either parallel or perpendicular to wafer flat 21. All dicing lanes that are parallel to wafer flat 21, for example dicing lanes 34 and 35, are referred to as horizontal dicing lanes. Dicing lanes that are perpendicular to wafer flat 21, for example dicing lanes 36 and 37, are referred to as vertical dicing lanes. It will be understood that horizontal dicing lanes 34 and 35 and vertical dicing lanes 36 and 37 are designated only as examples of a larger number of both horizontal and vertical dicing lanes as depicted in FIG. 1.

A plurality of vertical wafer conductors, for example vertical wafer conductors 42, 43, 44, 45, 46 and 47, are shown parallel to vertical dicing lanes 36 and 37 and overlying integrated circuit die 25, 28 and 31. The vertical wafer conductors 42–47 are electrically insulated from the underlying integrated circuits by an insulating layer (not shown). At predetermined locations, however, each vertical conductor 42–47 can be electrically coupled to integrated circuit dice. Horizontal wafer conductors (not shown) are formed within horizontal dicing lanes. For example, referring to FIG. 2, horizontal wafer conductors 52 and 53 are shown within horizontal dicing lane 35. Turning again to FIG. 1, a plurality of wafer test pads 38 are shown located around the periphery of semiconductor wafer 20. Wafer test pads 54, 55, 56, 57, 58 and 59 are each members of the plurality of wafer test pads 38. Wafer test pads 54–59 are each electrically coupled to either a vertical or horizontal wafer conductor. For example, wafer test pad 57 is shown electrically coupled to vertical wafer conductor 47. In addition, while the embodiment of FIG. 1 does not show any of the plurality of wafer test pads 38 formed overlying any die of plurality of semiconductor dice 22, it will be understood that this is for ease of illustration only, and that some embodiments of the present invention can have one or more test pads 38 overlying a die of plurality of semiconductor dice 22 or a portion thereof.

Figure 2:
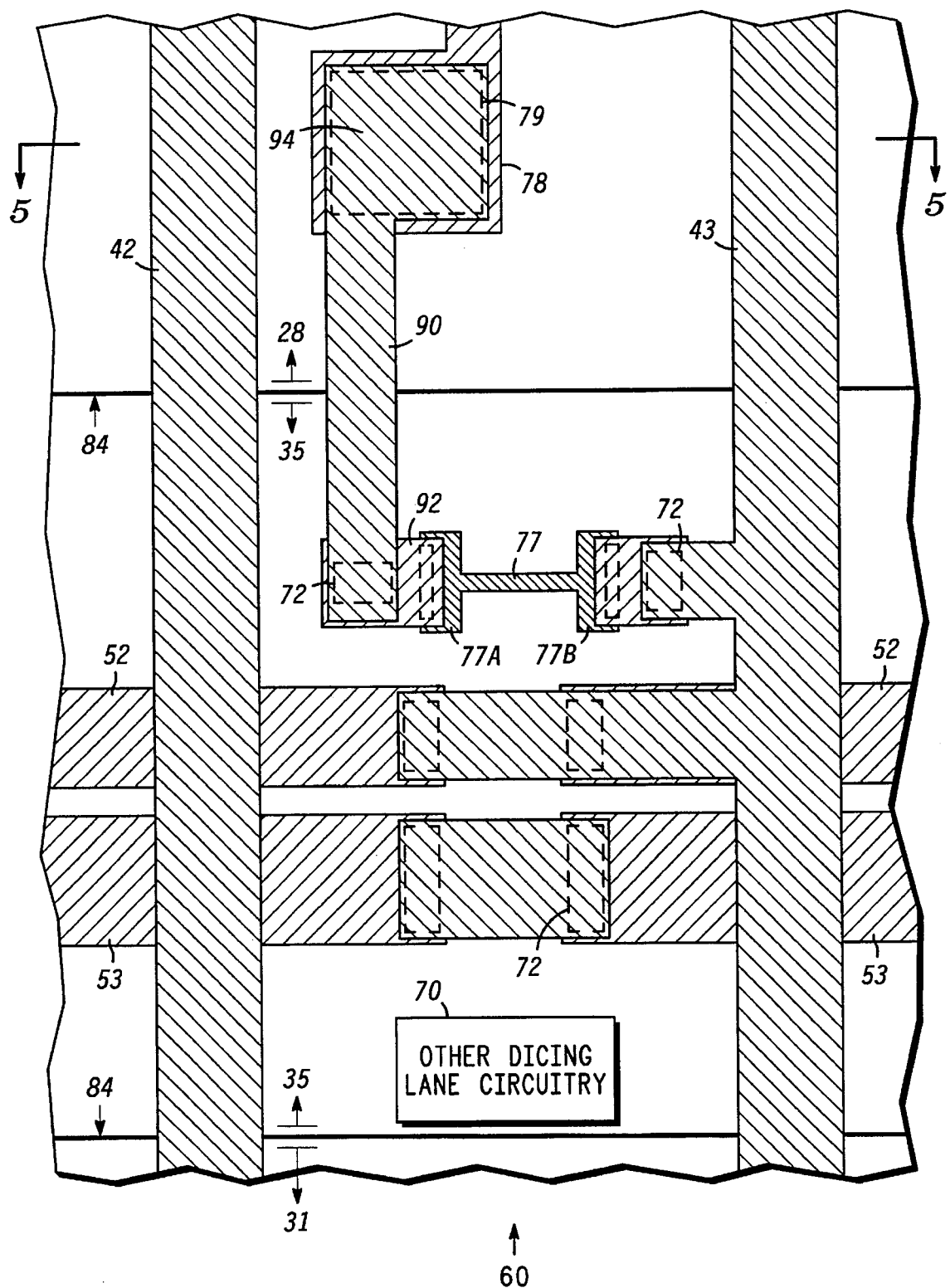
FIG. 2 is an enlarged plan view of a portion of the semiconductor wafer of FIG. 1.

FIG. 2 is an enlarged plan view of a portion 60 of a semiconductor wafer formed in accordance with an embodiment of the present invention. Specifically, portions of integrated circuit dice 28, 31 and horizontal dicing lane 35 are shown (see FIG. 1).

Horizontal dicing lane 35 separates semiconductor die 28 from semiconductor die 31, while edges 84 separate each die (28, 31) from dicing lane 35. Horizontal wafer conductors 52 and 53 are shown formed within horizontal dicing lane 35. Vertical wafer conductors 42 and 43 are shown crossing over dicing lane 35 and the horizontal wafer conductors 52 and 53 contained therein. It should be understood that horizontal wafer conductors 52 and 53 are formed from a different conductive layer than vertical wafer conductors 42 and 43, and the horizontal and vertical wafer conductors are electrically isolated from each other by an insulating layer (not shown). Thus the insulating layer (not shown) allows for horizontal wafer conductors 52 and 53 to cross under vertical wafer conductors 42 and 43 without electrical coupling. Therefore, to effect electrical coupling between a horizontal and a vertical wafer conductor, for example between horizontal wafer conductor 52 and vertical wafer conductor 43, an opening or via 72 must be formed in the insulating layer (not shown).

In order to facilitate wafer level testing and burn-in, a variety of electrical circuitry can be formed in dicing lanes. For example, in the embodiment of the present invention shown in FIG. 2, a resistor is used to protect against excessive current flow between a wafer conductor and a bonding pad. Thus, a resistor 77 having a first end 77A and a second end 77B is shown formed within dicing lane 35. First end 77A is electrically coupled to bonding pad 78 of die 28 through vertical conductor 90 and horizontal conductor 92. Second end 77B is electrically coupled to vertical wafer conductor 43. It will be understood that circuitry other than a resistor may be disposed within the dicing lanes. It will also be understood that any circuitry formed in dicing lanes, such as resistor 77, can alternatively be electrically coupled to a die and a horizontal wafer conductor, for example horizontal conductor 52, and that different methods of electrical coupling are design choices all of which are intended to be within the scope of the present invention.

At a first end, vertical conductor 90 is electrically coupled to horizontal conductor 92 through conductive via 72. At a second end, vertical conductor 90 is terminated in contact pad 94 which overlies bonding pad 78 extending beyond bonding pad via 79 as depicted in FIG. 2. Thus when contact pad 94 is formed, bonding pad 78 is not disturbed.

Figure 3:
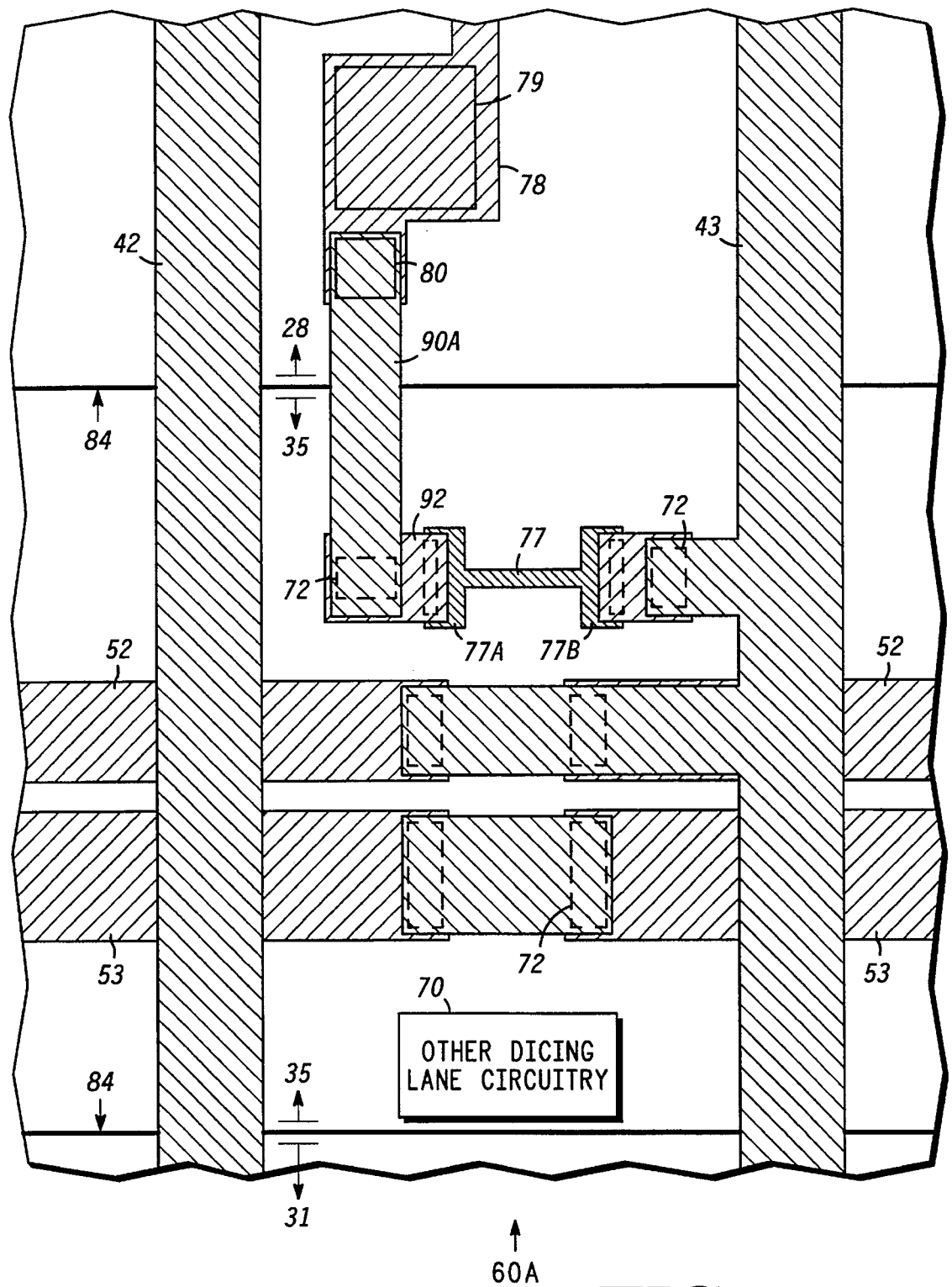
FIGS. 3–4 are enlarged plan views of a portion similar to that shown in FIG. 2 showing alternative embodiments of a prior art method.

Turning to FIG. 3, a portion 60A of a semiconductor wafer formed in accordance with an embodiment of Dasse et al., previously incorporated herein by reference, is shown. In this embodiment a mini-contact pad 80 is used to complete electrical coupling of bonding pad 78A to conductor 90A. Dasse et al. assert that mini-contact pad 80 is formed so that an etch process required to subsequently remove wafer conductor 90A will not undercut bonding pad via 79A and disturb bonding pad 78A.

Figure 4:
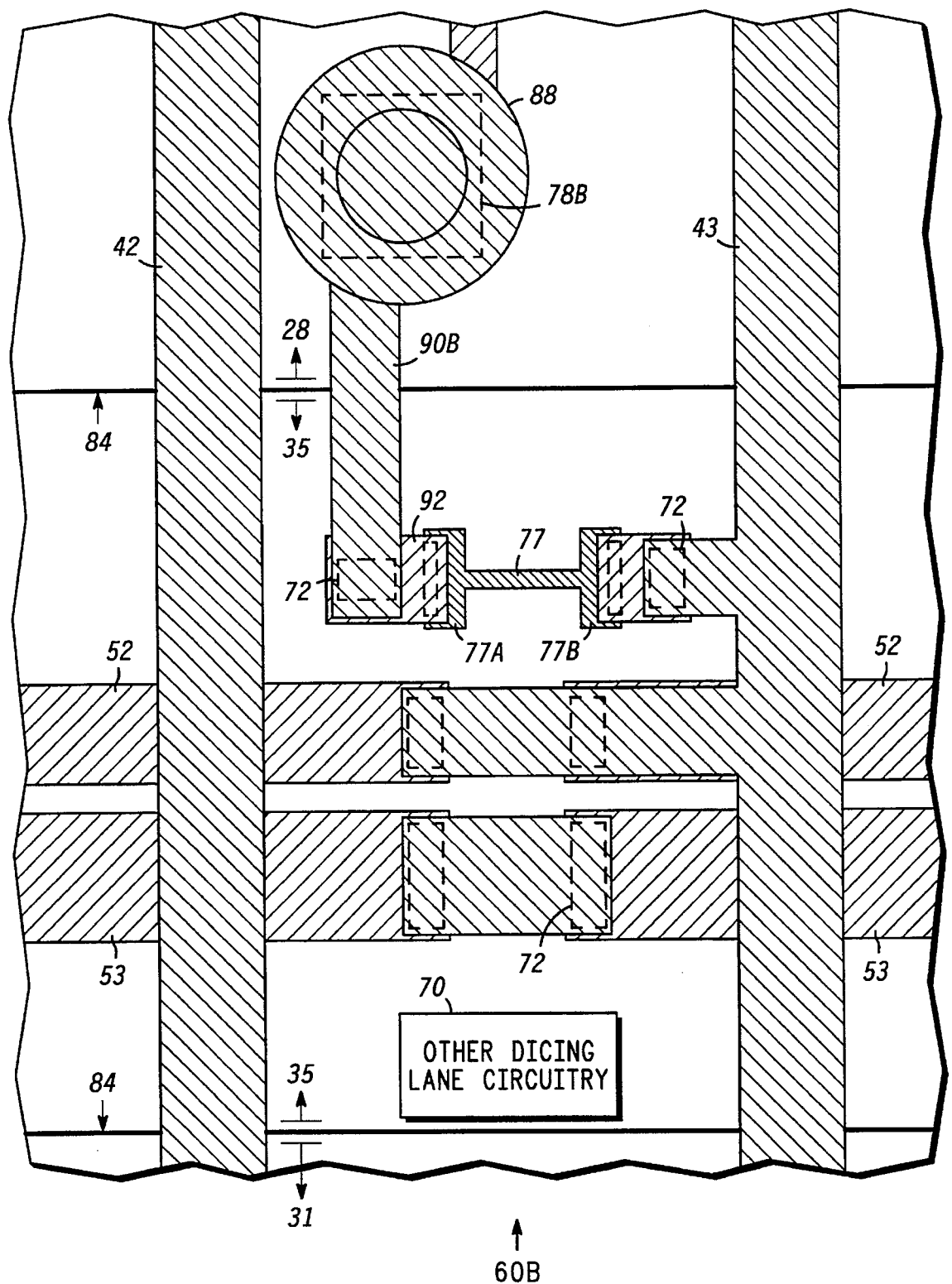

In FIG. 4, a portion 60B of a semiconductor wafer formed in accordance with another embodiment of Dasse et al. is shown. It should be noted that portion 60 of FIG. 2, portion 60A of FIG. 3 and portion 60B of FIG. 4 all represent similar regions of semiconductor wafer 20. It should be further noted that the only differences between the aforementioned portions are in the area of bonding pad 78. The embodiment of FIG. 4, utilizes bump 88 to complete electrical coupling between bonding pad 78B and conductor 90B. In this embodiment, bump 88 is too large to be removed by an etch process step designed to remove wafer conductor 90B, thus bump 88 remains in position and protects bonding pad 78B. Thus FIGS. 3 and 4 represent two alternative embodiments for coupling wafer conductor 90 to bonding pad 78 and providing for the subsequent removal of wafer conductor 90. The first embodiment, in FIG. 3, will allow wire bonding of die 28 when semiconductor die 28 is packaged and the second embodiment in FIG. 4 provides for the use of bumps 88 to electrically couple semiconductor die 28 to, for example, a printed circuit board. In will be understood that a successful implementation of either of the two embodiments of Dasse et al. require process differentiation at the time bonding pad 78A, 78B and bonding pad via 79A, 79B are formed.

In comparison, the embodiment of the present invention shown in FIG. 2 protects bonding pad 78 while not requiring process differentiation until after wafer-level testing and/or burn-in is completed. In FIG. 2, bonding pad 78 is shown electrically coupled to wafer conductor 90 through bonding pad via 79. Wafer conductor 90 comprises contact pad 94 which is disposed over bonding pad via 79 as previously described. Thus contact pad 94 is formed to enable electrical coupling between wafer connector 90 and bonding pad 78 as well as to protect bonding pad 78 when wafer conductor 90 is subsequently removed. Therefore, the need for mini-bonding pad 80 and bump 88 of FIGS. 3 and 4, respectively, are not required by the present invention.

Figure 5:
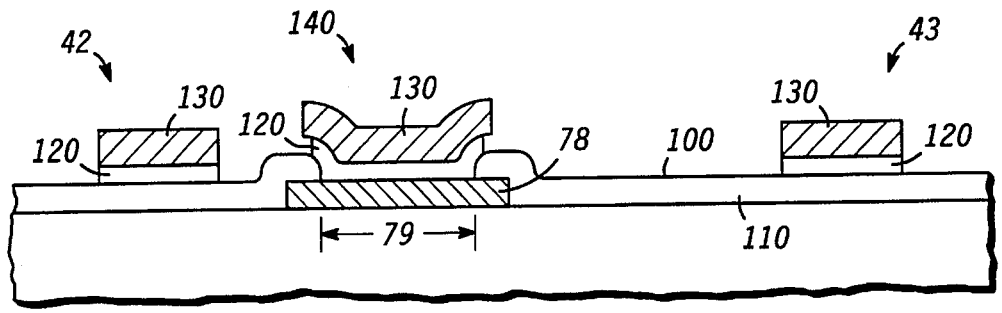
FIG. 5 is an enlarged cross sectional view along sectional line 5—5 of FIG. 2.

FIG. 5 is an enlarged cross sectional view of portion 60 of FIG. 2, taken through section 5—5. Bonding pad 78 extends to an upper surface 100 of second insulation or passivation layer 110 through a bonding pad via or opening 79 formed in the passivation layer 110 disposed on semiconductor wafer 20. Bonding pad via 79 is formed so that only an edge of bonding pad 78 remains overlaid by passivation layer 110.

Typically, bonding pad 78 is comprised of aluminum while passivation layer 110 can be comprised of any of the commonly employed passivation materials, such as silicon oxide, silicon nitride or the like.

Contact pad 140 is comprised of conductive etch-barrier layer 120 and conductive layer 130. Conductive layer 130 is typically comprised of aluminum or copper. Conductive etch-barrier layer 120 can be comprised of any conductive material that will remain essentially unetched by an etch process that will remove conductive layer 130. In addition, conductive etch-barrier layer 120 must be removable without disturbing bonding pad 78. Where bonding pad 78 is comprised of aluminum and conductive layer 130 is comprised of aluminum or copper, a conductive etch-barrier layer 120 comprised of titanium-tungsten alloy (TiW) is effective. Conductive etch-barrier layer 120 can prevent disturbance of bonding pad 78 if conductive etch-barrier layer 120 extends beyond the boundaries of bonding pad via 79 as depicted in FIG. 5. It has also been found that it is desireable for conductive etch-barrier layer 120 to have a certain minimum thickness to prove effective as an etch barrier. Thus for a conductive etch-barrier layer 120 comprised of TiW, overlying a passivation layer 130 having a thickness of between approximately 300 to 500 nanometers (nm), a thickness of at least approximately 50 nm can provide this etch barrier characteristic. However it is known that deposition methods and techniques can affect layer integrity, thus a thickness of at least approximately 80 nm would be desirable and a thickness of at least approximately 120 nm would be preferred where passivation layer 130 is between approximately 500 to 1000 nm.

FIG. 5 also shows cross sectional views of vertical wafer conductors 42 and 43 overlying passivation layer 110. Vertical wafer conductors 42 and 43 are comprised of conductive etch-barrier layer 120 and conductive layer 130. While vertical wafer conductors 42 and 43 do not require conductive etch-barrier layer 120, layer 120 is incorporated into vertical wafer conductors 42 and 43 for ease and simplicity in fabrication.

Figure 6:
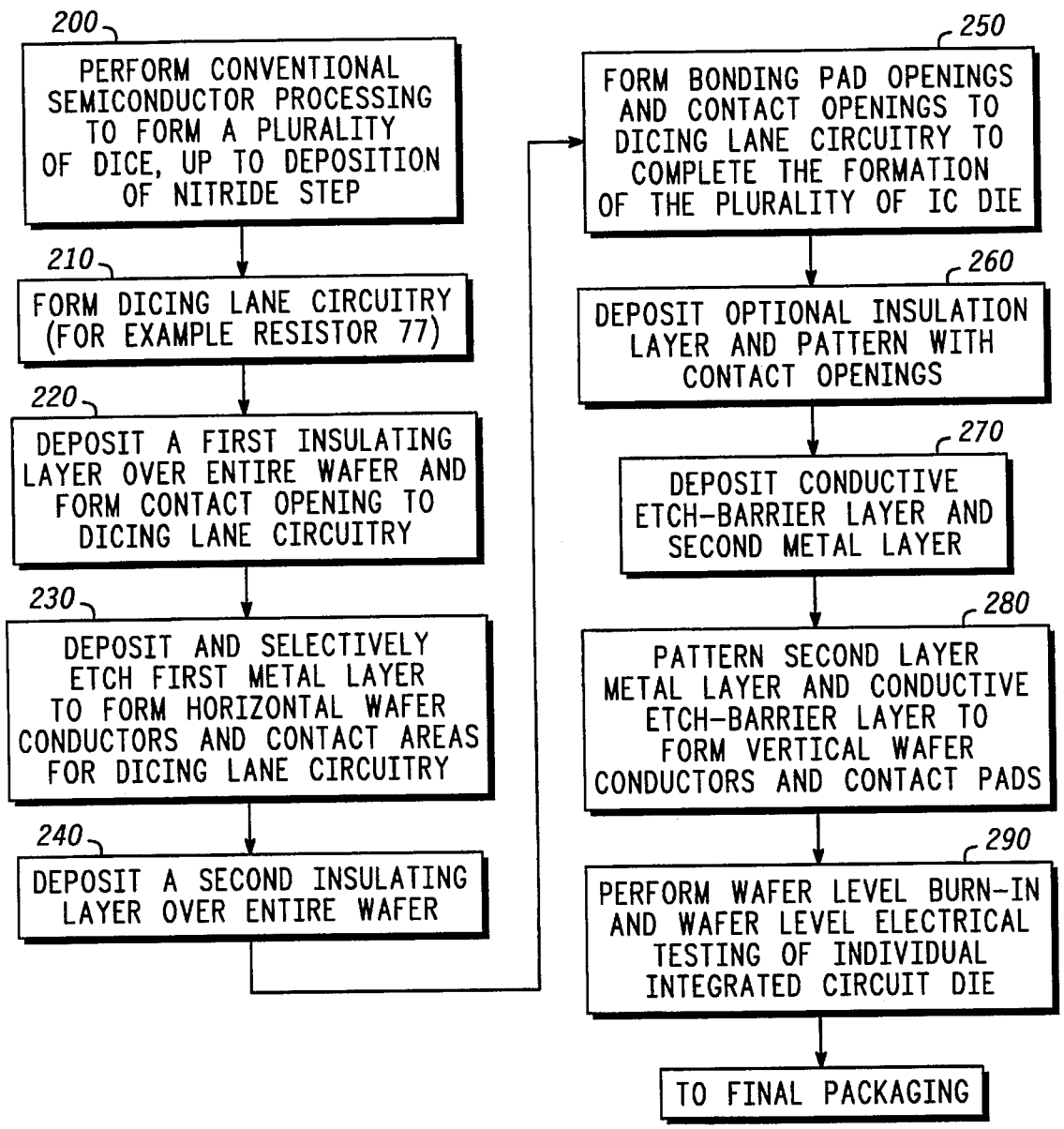
FIG. 6 illustrates, in flow diagram form, a method of forming a semiconductor wafer in accordance with an embodiment of the present invention.

FIG. 6 is a flow chart illustrating a portion of the process flow for the embodiment of the present invention, illustrated in FIG. 2. It will be understood that Step 200 through and including Step 250 comprise conventional semiconductor processing procedures and materials well known to those skilled in the art which do not need to be modified to practice the present invention. For example, Step 200 represents the start of semiconductor processing and all conventional processing up to a nitride deposition; Step 210 forms dicing lane circuitry; Step 220 is the deposition of a first insulating layer and the formation of contact openings to dicing lane circuitry; Step 230 is the deposition and etch of a first metal layer to form, among other things, horizontal wafer conductors; Step 240 is the deposition of a second insulating layer; and Step 250 is the formation of bonding pad and contact openings to dicing lane circuitry thus completing a standard die process.

However, Steps 260, 270 and 280 do include additional processing that comprise the formation of structures to allow wafer-level testing and burn-in of the plurality of semiconductor dice 22 formed on semiconductor wafer 20. In an embodiment of the present invention, it can be desirable to deposit an optional insulation layer overlying the second insulation layer 110 (FIG. 5) such as with Step 260. Optional insulation layer (not shown) can be formed from a variety of insulating materials such as polyimide, silicon oxide, silicon nitride or a combination of such materials. Such insulation layers are well known. If optional insulation layer (not shown) is employed, contact openings are formed through the optional insulation layer (not shown), as well as through passivation layer 110 (FIG. 5) to allow for electrical coupling of circuitry on the plurality of semiconductor dice 22 (FIG. 1) and within dicing lanes, for example resistor 77 (FIG. 2), with any subsequently deposited conductive layers.

Step 270 comprises the deposition of the various conductive layers. First a conductive etch-barrier layer 120 (FIG. 5) is deposited to overlie optional insulation layer (not shown), if employed, or passivation layer 110 (FIG. 2). A conductive layer 130 (FIG. 2) is then deposited to overlie conductive etch-barrier layer 120 (FIG. 2). It will be understood that each layer is electrically coupled to each of the plurality of semiconductor dice 22 (FIG. 1) and any dicing lane circuitry, such as resistor 77 (FIG. 2) through contact openings or vias formed in the aforementioned insulation layers, for example through bonding pad via 79 (FIG. 2).

Step 280 comprises the patterning of conductive etch-barrier layer 120 and conductive layer 130 (FIG. 5). It will be understood that this patterning step comprises the deposition and patterning of a first photoresist layer, followed by the etching of conductive layer 130 to expose portions of conductive etch-barrier layer 120 (FIG. 5). Subsequent to etching conductive layer 130, the exposed portions of conductive etch-barrier layer 120 are removed. Layer 130 and layer 120 are etched independently to form a pattern that includes vertical wafer conductors, such as conductors 42–47, and a plurality of peripheral wafer test pads 38 (FIG. 1), and contact pads 140 (FIG. 5). Thus, contact pads 140 (FIG. 5) are electrically coupled to wafer conductors, for example vertical wafer conductors 42–47, which are electrically coupled to plurality of peripheral wafer test pads 38.

Step 290 comprises the actual performance of wafer level electrical test and/or wafer level burn-in. Thus, each of the plurality of semiconductor dice 22 (FIG. 1) can be electrically coupled through plurality of wafer test pads 38 to a test and burn-in apparatus (not shown) and the number and location of known good die determined. Once testing and burn-in are complete, semiconductor wafer 20 and the known good die contained thereon can be prepared for final packaging.

In an embodiment of the present invention, shown in FIG. 5, various layers formed upon semiconductor wafer 20 can be removed. Thus conductive layer 130 is removed leaving conductive etch-barrier layer 120 in place to protect bonding pads 78. Next, conductive etch barrier layer 120 is removed to expose bonding pads 78. Thus a plurality of semiconductor dice 22 (FIG. 1) is provided that can be singulated and subsequently packaged employing wire bonding to effect electrical coupling with the circuitry therein.

Another embodiment of the present invention includes removing conductive layer 130 and depositing a photoresist layer (not shown) so that only that portion of conductive etch-barrier layer 120, not overlying bonding pads 78, will be removed. In this manner, plurality of semiconductor dice 22 (FIG. 1) are provided ready for the formation of conductive bumps (not shown). For example, copper bumps could be formed by copper plating techniques.

In still another embodiment of the present invention, a layer of photoresist (not shown) can be deposited before etching conductive layer 130 so that only a portion of both conductive layer 130 and conductive etch-barrier layer 120 are removed. In this manner a complete contact pad 140 overlying bonding pads 78 is left in place.

Thus alternative embodiments for the formation of conductive bumps (not shown) are provided. It will be noted as an advantage of the present invention that each of the embodiments described is derived from a commonly processed semiconductor wafer, and that the availability of this multitude of embodiments is made possible by the use of conductive etch-barrier layer 120 and conductive layer 130 to form contact pads 140 which overlie each of the plurality of bonding pads 78.

Figure 7:
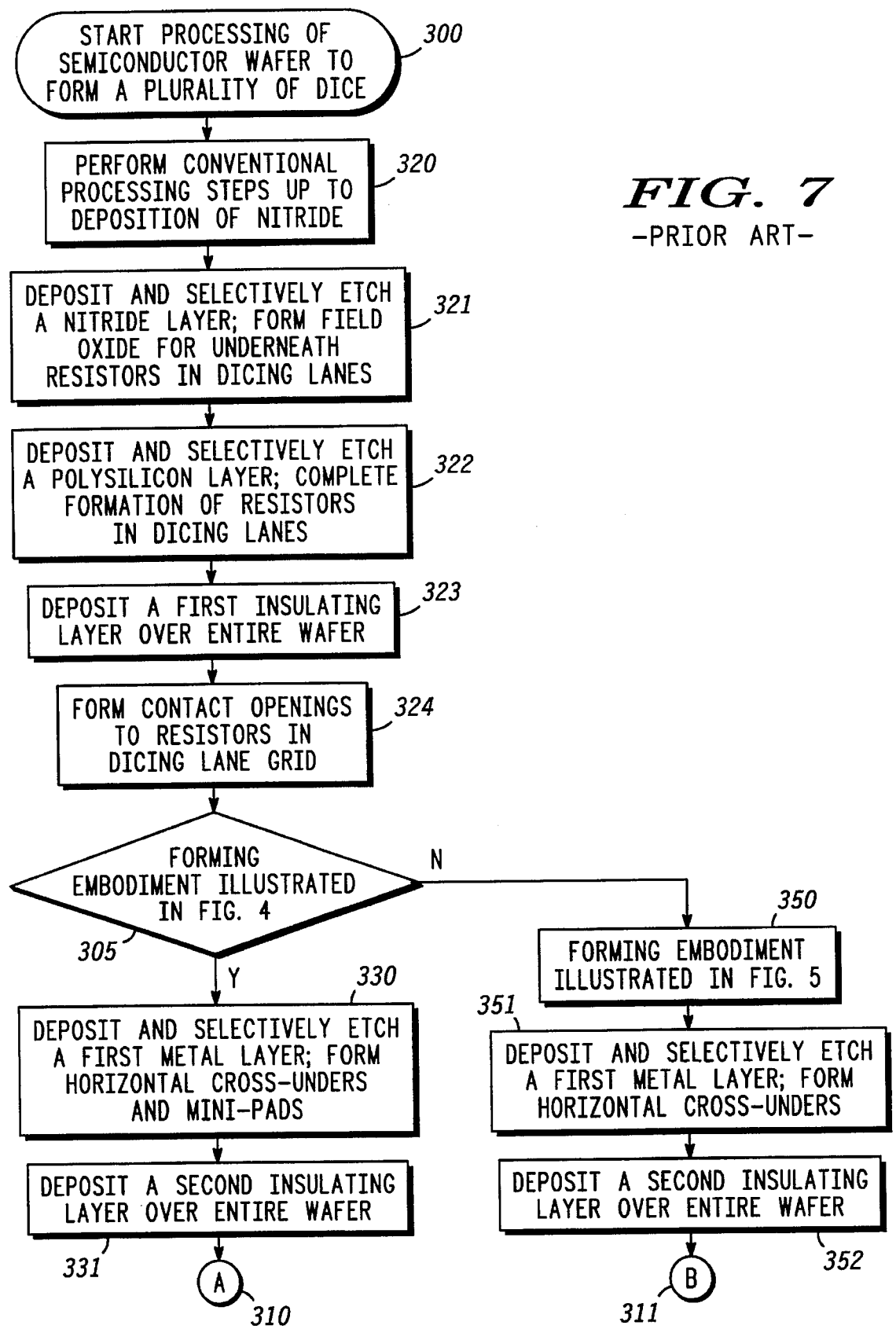

FIGS. 7–8 illustrate the process flows for the Dasse et al. embodiments of FIGS. 3 and 4. It will be noted that process Steps 320 through 324 are essentially equivalent to process Steps 210 and 220 of FIG. 6. However, after Step 324, the process of Dasse et al. reaches a dividing point at diamond 305.

Thus if the embodiment of FIG. 3 is desired, the process Steps 300 through 324 and Steps 330 through 331 to form wafer 'A' 310 followed by Steps 332 to 339 to form wafer 'C' 312. Thus Step 300 starts the processing to form a plurality of die; Step 320 performs conventional process up to a nitride deposition step; Step 321 is a nitride deposition and selective etch followed by a field oxidation; Step 322 is a polysilicon deposition and selective etch; Step 323 deposits a first insulating layer; Step 324 forms contact openings to resistors formed in dicing lanes; Step 330 deposits and selectively etches a first metal layer forming mini-pads; and Step 331 deposits a second insulating layer to form wafer 'A' 310. Step 332 forms via contact openings to connect first and second metal layers; Step 333 completes the formation of the plurality of dice; Step 334 deposits a third insulation layer; Step 335 removes third insulation layer from mini-pads and bonding pads; Step 336 deposits and selectively etches a second metal layer to form vertical wafer conductors and couple mini-pads to vertical conductors; Step 337 performs electrical testing; Step 338 removes portions of second metal layer and Step 339 removes second insulation layer to form wafer 'C' 312. requires that mini-pads 80 must be formed. On the other hand, if the embodiment of FIG. 4 is desired, process Step 351 does not form such a structure. Thus, rather than a single process flow, as shown in FIG. 6, two distinct process flows are required to form two different embodiments of wafer 'C' 312. Thus commonality in processing is not available.

If the embodiment of FIG. 4 is desired, the process Steps 300 through 324 and Steps 350 through 351 to form wafer 'B' 311 followed by Steps 352 to 359 to form wafer 'C' 312. It will be understood that Steps 300 through 324 are identical for both embodiments, and that process differentiation from the embodiment of FIG. 3 begins with Step 351. Step 351 deposits and selectively etches a first metal layer, however no mini-pads are formed; Step 352 deposits a second insulation layer to form wafer 'B' 311. Step 353 forms via contact openings to connect first and second metal layers and contact opening for bonding pads; Step 354 completes the formation of the plurality of dice; Step 355 deposits a third insulation layer; Step 356 removes third insulation layer from bonding pads; Step 357 deposits and selectively etches a second metal layer to form vertical wafer conductors and couples bonding pads to vertical conductors; Step 358 forms a metal bump over each bonding pad; Step 359 performs electrical testing; and Step 360 removes all second metal to form wafer 'C' 312.

By now it should be appreciated that a new method has been disclosed for forming contact pads for wafer level testing and burn-in of semiconductor die. The method provides for forming semiconductor die with essentially standard semiconductor processing. The method additionally provides for forming contact pads overlying bonding pads that allow either wire bonding or conductive bump formation subsequent to wafer level testing.

It will be understood that the method in accordance with the present invention offers advantages over prior art methods in eliminating a requirement to designate semiconductor die to a particular form a final packaging prior to completion of standard processing. As one skilled in the art knows, such a designation adds additional cost in the reduced flexibility of scheduling a fabrication area, as well as adding complexity in that different masks and processing are required for functionally identical devices. Thus processing and inventory costs are reduced over the prior art methods. Finally, by providing a common methodology through the fabrication process, increased opportunities for yield optimization are realized thus ultimately allowing for reduced costs.

What we claim is:

1. A method for forming contact pads for wafer level testing of integrated circuit die comprising the steps of:

providing a semiconductor substrate having a plurality of integrated circuit die formed thereon, wherein each integrated circuit die has a plurality of bonding pads;

forming a conductive etch-barrier layer overlying and electrically coupled to the plurality of bonding pads; and forming a conductive layer overlying the conductive etch-barrier layer, wherein the conductive layer is electrically coupled to the plurality of bonding pads, and whereby the conductive etch-barrier layer protects the plurality of bonding pads when the conductive layer is patterned and etched to form a contact pad overlying at least one of the plurality of bonding pads.

2. The method of claim 1, wherein the step of providing a semiconductor substrate further comprises forming an opening in a passivation layer wherein each of the plurality of bonding pads extends to an upper surface of the semiconductor substrate through said opening.

3. The method of claim 1, wherein the step of providing a semiconductor substrate further comprises forming the plurality of bonding pads from a metal comprising aluminum.

4. The method of claim 1, wherein the step of forming a conductive etch-barrier layer further comprises forming the conductive etch-barrier layer from a titanium-tungsten alloy.

5. The method of claim 1, wherein the step of forming a conductive layer further comprises forming the second conductive layer from a metal comprised of aluminum or copper.

6. The method of claim 1, further comprising the steps of:

patterning the conductive layer by etching to expose portions of the conductive etch-barrier layer; and removing exposed portions of the conductive etch-barrier layer to form the contact pads.

7. The method of claim 6, wherein the step of patterning the conductive layer further comprises forming a pattern that includes a plurality of wafer test pads at a periphery of the semiconductor substrate, wherein the plurality of wafer test pads are electrically coupled to the contact pads such that each integrated circuit die is uniquely identified.

8. The method of claim 7, further comprising the step of performing a wafer level electrical test of the plurality of integrated circuit die.

9. The method of claim 8, wherein the step of performing a wafer level electrical test further comprises a wafer level burn-in.

10. The method of claim 6, further comprising the steps of:

removing the conductive layer;

removing the conductive etch-barrier layer; and singulating the plurality of integrated circuit die, wherein each integrated circuit die is suitable for wire bonding or forming conductive bumps.

11. The method of claim 6, further comprising the steps of:

removing the conductive layer;

removing portions of the conductive etch-barrier layer not overlying the bonding pads;

forming conductive bumps overlying the conductive etch-barrier layer, wherein said conductive bumps are electrically coupled to the bonding pads; and singulating the plurality of integrated circuit die.

12. The method of claim 6, further comprising the steps of:

removing portions of the conductive layer and the conductive etch-barrier layer, wherein unremoved portions of the conductive layer and the conductive etch-barrier layer overlie the plurality of bonding pads;

forming conductive bumps overlying the conductive layer, wherein said conductive bumps are electrically coupled to the bonding pads; and singulating the plurality of integrated circuit die.

13. A method of manufacturing integrated circuit die that have been tested at the wafer level comprising the steps of:

providing a semiconductor substrate having a plurality of integrated circuit die formed thereon, wherein each integrated circuit die has a plurality of bonding pads extending to an upper surface of the semiconductor substrate;

forming a etch-barrier layer overlying the upper surface, wherein the etch-barrier layer is electrically coupled to the plurality of bonding pads;

forming a conductive layer overlying the etch-barrier layer, wherein the conductive layer is electrically coupled to the plurality of bonding pads;

patterning the conductive layer and the etch-barrier layer such that each integrated circuit die is uniquely electrically coupled;

electrically testing the plurality of integrated circuit die;

removing at least a portion of the conductive layer; and removing at least a portion of the etch-barrier layer.

14. The method as in claim 13, wherein the step of patterning the conductive layer and the etch-barrier layer further comprises forming a plurality of wafer test pads.

15. The method as in claim 14, wherein the step of forming a plurality of wafer test pads further comprises forming the wafer test pads at a peripheral edge of the upper surface.

16. The method as in claim 13, wherein the step of electrically testing the plurality of integrated circuit die further comprises performing an electrical burn-in.

17. The method as in claim 13, wherein the step of electrically testing the plurality of integrated circuit die, further comprises performing a functionality test for each of the plurality of integrated circuit die.

18. The method as in claim 13, wherein the step of patterning the conductive layer and the etch-barrier layer, further comprises the steps of:

depositing and patterning a layer of photoresist to expose selected portions of the conductive layer;

removing selected portions of the conductive layer to expose portions of the etch-barrier layer; and removing exposed portions of the etch-barrier layer, wherein remaining portions of the conductive layer are essentially unperturbed.

19. The method as in claim 13, wherein the step of removing at least a portion of the conductive layer, further comprises the steps of:

depositing a layer of photoresist over the conductive layer;

patterning the layer of photoresist to protect portions of the conductive layer overlying the plurality of bonding pads; and etching unprotected portions of the conductive layer to expose portions of the etch-barrier layer.

20. The method as in claim 13, wherein the step of forming a conductive layer comprises forming a layer comprised of copper or aluminum.

21. The method as in claim 13, further comprising the step of forming a plurality of conductive bumps overlying the plurality of bonding pads, wherein each of the plurality of conductive bumps is uniquely electrically coupled to an underlying contact area.

22. The method as in claim 13, further comprising the step of singulating each of the plurality of integrated circuit die.

* * * * *